United States Patent
Wu et al.

(10) Patent No.: US 8,248,820 B2
(45) Date of Patent: Aug. 21, 2012

(54) ELECTRONIC DEVICE WITH POWER SUPPLY

(75) Inventors: Hung-Yi Wu, Taipei Hsien (TW); Xiao-Zhu Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 194 days.

(21) Appl. No.: 12/874,182

(22) Filed: Sep. 1, 2010

(65) Prior Publication Data

US 2012/0026711 A1  Feb. 2, 2012

(30) Foreign Application Priority Data

Jul. 30, 2010  (CN) .......................... 2010 1 0241315

(51) Int. Cl.
  *H05K 7/02* (2006.01)
  *H05K 7/04* (2006.01)
(52) U.S. Cl. .................. 361/807; 361/752; 361/730
(58) Field of Classification Search .......... 361/728–730, 361/732, 752, 796, 800, 807, 810; 439/491, 439/502, 578, 638, 639, 640, 701, 371, 373; 312/223.1, 223.2

See application file for complete search history.

(56) References Cited

U.S. PATENT DOCUMENTS

| | | | | |
|---|---|---|---|---|
| 5,578,876 A | * | 11/1996 | Crampton | 307/80 |
| 5,681,183 A | * | 10/1997 | Dzmura | 439/502 |
| 6,109,958 A | * | 8/2000 | Ke | 439/535 |
| 6,739,896 B2 | * | 5/2004 | Sivertsen | 439/371 |
| 7,052,305 B2 | * | 5/2006 | Kurokawa | 439/371 |
| 7,513,791 B1 | * | 4/2009 | Gary | 439/373 |
| 7,580,266 B2 | * | 8/2009 | Miller et al. | 361/728 |
| 7,850,478 B2 | * | 12/2010 | Lin et al. | 439/373 |
| 2008/0046767 A1 | * | 2/2008 | Hsu et al. | 713/300 |

* cited by examiner

*Primary Examiner* — Hung S Bui
(74) *Attorney, Agent, or Firm* — Altis Law Group, Inc.

(57) ABSTRACT

An electronic device includes a chassis, a power supply secured to the chassis adjacent to a rear wall of the chassis, a switch cable, a first cable clamp mounted to the chassis adjacent to an opening defined in a front wall of the chassis. The power supply includes an input connector, by which the power supply electrically connected to a power source. The switch cable includes a first connector electrically coupled to the input connector of the power supply, and a second connector exposed through the opening of the front wall to be electrically coupled to the power source. The first cable clamp retains the transforming cable in the chassis.

7 Claims, 4 Drawing Sheets

ELECTRONIC DEVICE WITH POWER SUPPLY

BACKGROUND

1. Technical Field

The present disclosure relates to an electronic device having a power supply.

2. Description of Related Art

A power supply received in a chassis of a server generally includes an input connector, which is traditionally accessible from one end of the chassis, and is convenient for a user to manipulate the power supply only when the end of the chassis is exposed. Otherwise, the sever chassis must be taken out of the server rack to manipulate the power supply, this is inconvenient.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
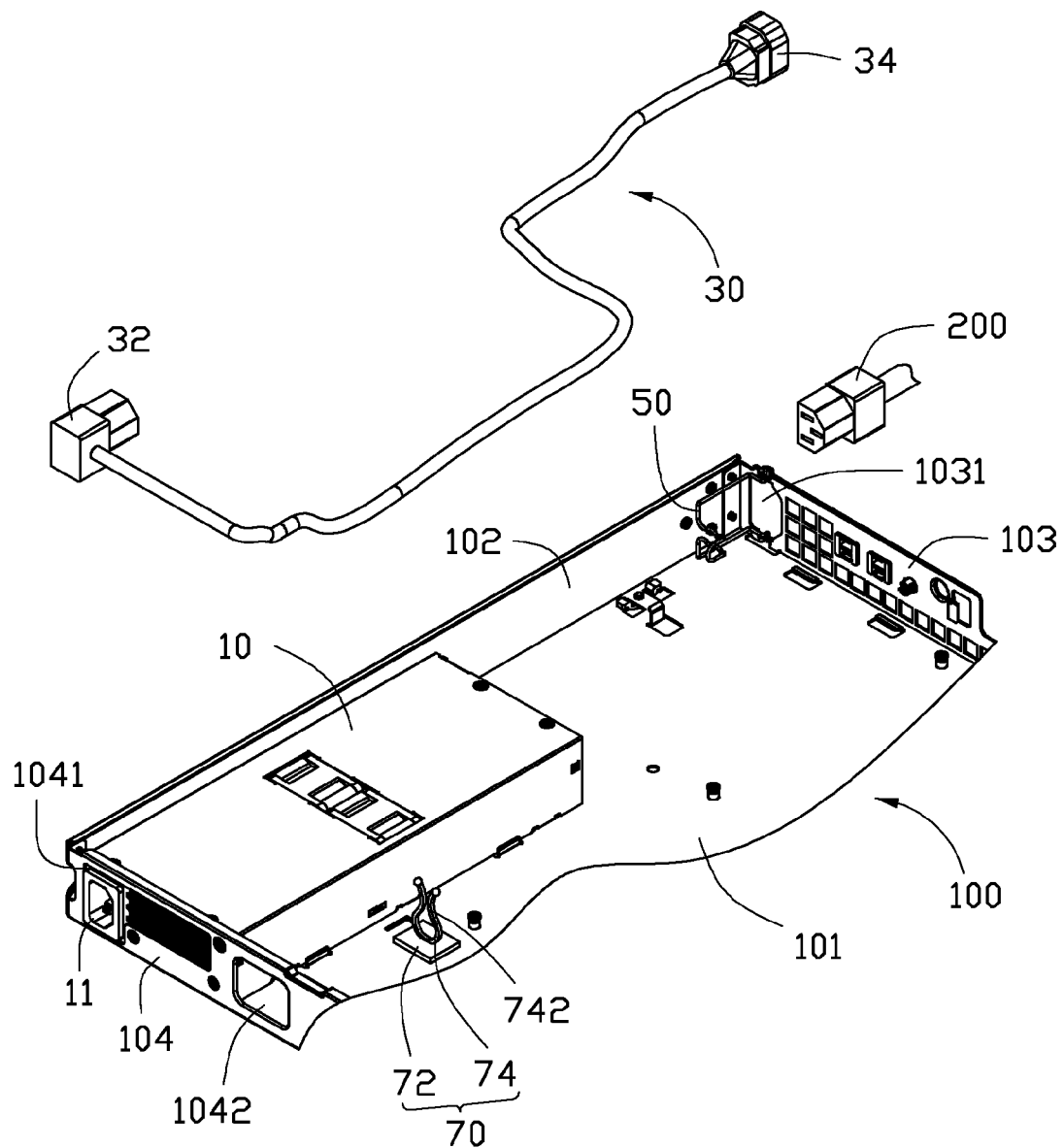
FIG. 1 is a partial, exploded, isometric view of an exemplary embodiment of an electronic device with a power supply assembly.
Figure 2:
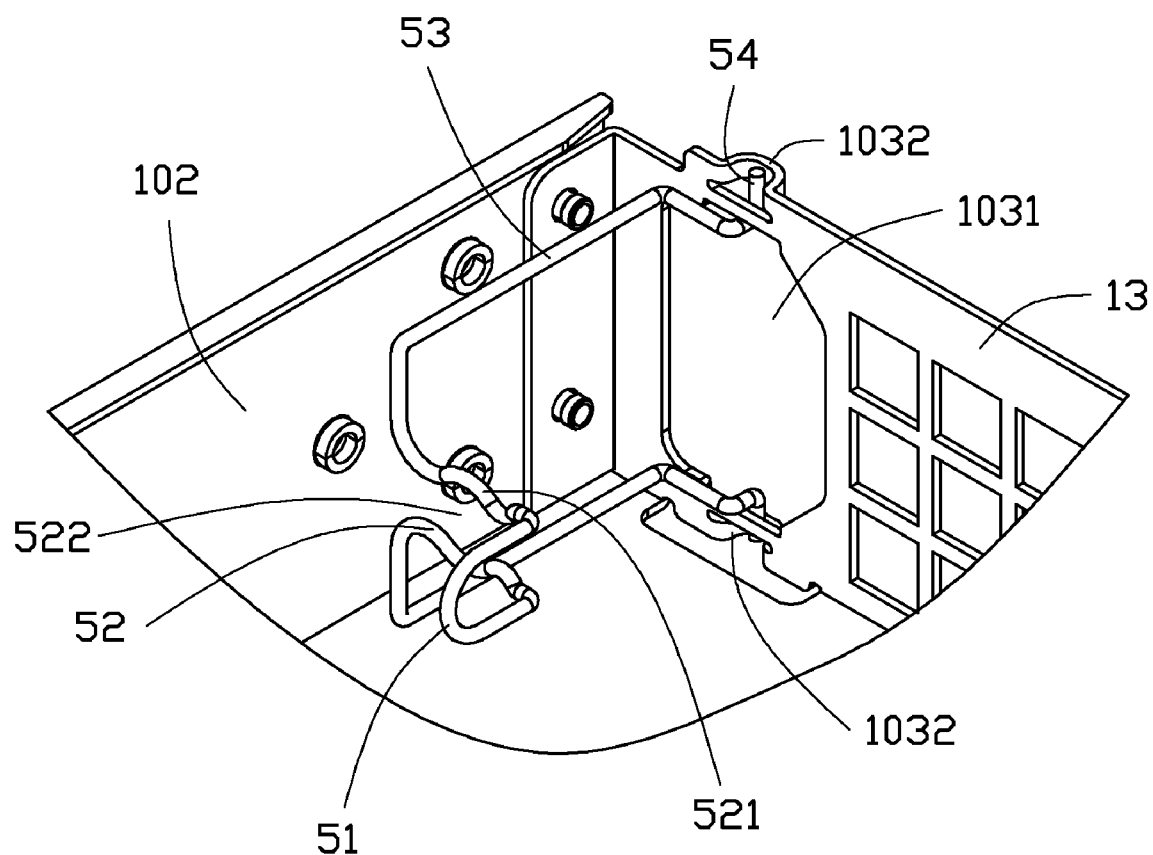
FIG. 2 is an enlarged, partial view of FIG. 1.

Referring to FIGS. 1 and 2, an exemplary embodiment of an electronic device includes a chassis 100, a power supply 10 received in the chassis 100, a switch cable 30, a first cable clamp 50, and a second cable clamp 70.

The chassis 100 includes a bottom plate 101, a sidewall 102 perpendicularly extending up from a side of the bottom plate 101, and a front wall 103 and a rear wall 104 perpendicularly extending up from the opposite front and rear ends of the bottom plate 101. A first opening 1031 is defined in the front wall 103 substantially adjacent to the sidewall 102. Two substantially arch-shaped tabs 1032 protrude from the front wall 103, are arranged at upper and lower sides of the first opening 1031, and away from the rear wall 104. A second opening 1041 and a third opening 1042 are defined in the rear wall 104.

The power supply 10 includes an input connector 11 at a rear end of the power supply 10.

The switch cable 30 includes a first connector 32 and a second connector 34 at opposite ends of the switch cable 30. The first connector 32 is adapted to mate with the input connector 11. The second connector is adapted to couple to an output connector of a power source 200.

In one embodiment, the first cable clamp 50 is a metal wire. The first cable clamp 50 is a distorted elongated piece of metal to form a substantially U-shaped operating segment 51 at a center of the metal wire. An opening of the operating segment 51 opposes the first opening 1031 of the chassis 100. Two clamping arms 52 correspondingly extending from opposite distal ends of the operating segment 51. Two elongated arms 53 correspondingly extend from distal ends of the clamping arms 52 away from the operating segment 51, and two mounting portions 54 are correspondingly formed at distal ends of the elongated arms 53. Each of the clamping arms 52 includes an arc-shaped retaining portion 521 protruding opposite to the other clamping arm 52. A retaining space is formed between the retaining portions 521 of the clamping arms 52.

The second cable clamp 70 includes a mount 72 fixed to the bottom plate 101 of the chassis 100, and a substantially U-shaped clamp body 74 depending on the mount 72. The clamp body 74 includes an elastic and narrow necked portion 742 opposite to the mount 72.

Figure 3:
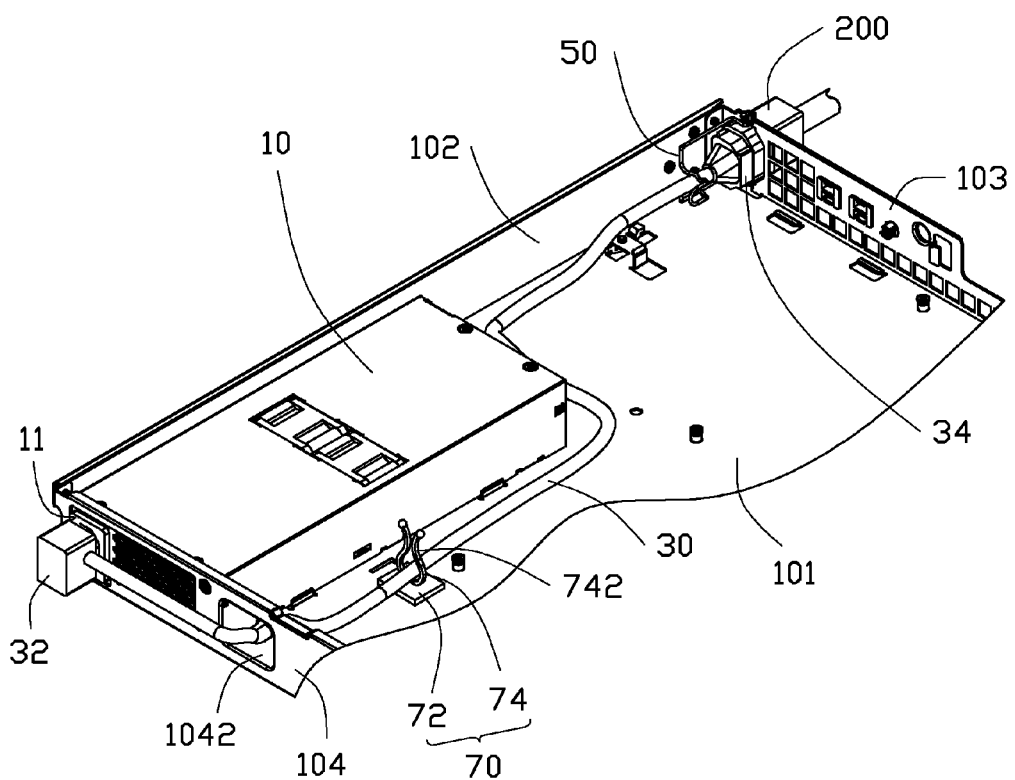
FIG. 3 is an assembled, isometric view of FIG. 1.
Figure 4:
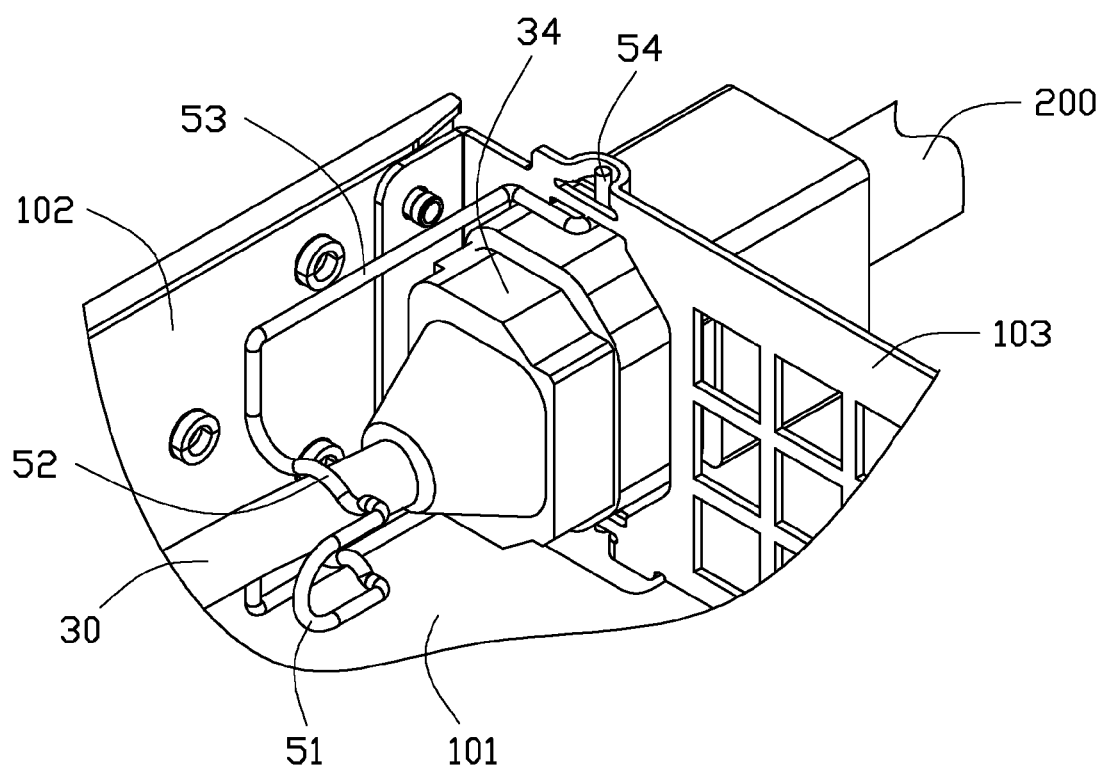
FIG. 4 is an enlarged, partial view of FIG. 3.

Referring to FIGS. 3 and 4, in assembly, the power supply 10 is positioned on the bottom plate 101 of the chassis 100, adjacent to the rear wall 104 and the sidewall 102. The input connector 11 of the power supply 10 is exposed through the second opening 1041 of the rear wall 104. The first cable clamp 50 is mounted to an inner side of the front wall 103 of the chassis 100, with the mounting portions 54 engaging with the corresponding tabs 1032 of the chassis 100 and the elongated arms 53 abutting the sidewall 102 of the chassis 100. The switch cable 30 extends through the third opening 1042 of the rear wall 104 of the chassis 100, with the first connector 32 of the switch cable 30 coupled to the input connector 11 of the power supply 10. The switch cable 30 is engaged in the lamping body 74 of the second cable clamp 70 through the necked portion 742, and the necked portion 742 can prevent the switch cable 30 from accidently disengaging from the second cable clamp 70. The operating segment 51 of the first cable clamp 70 is urged to distort the first cable clamp 50, and move the elongated arms 53 away from the sidewall 102 of the chassis 100. The switch cable 30 is engaged between the clamping arms 52, through a space between the elongated arms 53 and the sidewall 102 of the chassis 100. The operating segment 51 is released, thereby the first cable clamp 50 is restored, with the elongated arms 53 abutting the sidewall 102 again. Therefore, the switch cable 30 is retained in the first cable clamp 50, and the second connector 34 is exposed through the first opening 1031 of the front wall 103 of the chassis 100.

In use, when the front wall 103 of the chassis 100 is exposed to be conveniently accessible, the power source 200 may be coupled to the second connector 34 of the power supply 10, and the switch cable 30 may supply power from the power source 200 to the power supply 10. When the rear wall 103 of the chassis 100 is exposed to be conveniently accessible, the first connector 32 is removed from the input connector 11 of the power supply 10, and the power source 200 may be directly coupled to the input connector 11 of the power supply 10, to supply power to the power supply 10 directly.

It is to be understood, however, that even though numerous characteristics and advantages of the embodiments have been set forth in the foregoing description, together with details of the structure and function of the embodiments, the present disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. An electronic device comprising:
a chassis comprising a bottom plate, and a front wall and a rear wall extending up from opposite ends of the bottom plate, each of the front wall and the rear wall defining an opening;
a power supply received in the chassis, adjacent to the rear wall of the chassis, and comprising an input connector exposed through the opening of the rear wall of the chassis; the power supply adapted to be electrically connected to a power source by the input connector;
a switch cable including a first connector and a second connector at opposite ends of the switch cable, the first connector releasably coupled to the input connector of the power supply, the second connector releasably coupled to the power source and exposed through the opening of the front wall of the chassis; and
a first cable clamp mounted to the chassis, adjacent to the opening of the front wall of the chassis, to retain the switch cable in the chassis.

2. The electronic device of claim 1, wherein the first cable clamp is a distorted elongated piece of metal forming two clamping arms sandwiching the switch cable between the clamping arms.

3. The electronic device of claim 2, wherein the chassis further comprises two tabs protruding from the front wall of the chassis away from the rear wall, correspondingly at upper and lower sides of the opening of the front wall, the first cable clamp forms two mounting portions engaging with the corresponding tabs of the chassis.

4. The electronic device of claim 2, wherein the first cable clamp further comprises an operating portion connected to first ends of the clamping arms.

5. The electronic device of claim 4, wherein the chassis further comprises a sidewall extending up from a side of the bottom plate and connected between the front and rear walls, the first cable clamp further comprises two elongated arms extending from second ends of the corresponding clamping arms, and abutting the sidewall of the chassis, each of the elongated arms is movable away from the sidewall to enable the switch cable disengage from the clamping arms through a space defined between the sidewall and the elongated arms.

6. The electronic device of claim 1, further comprising a second cable clamp positioned on the bottom plate of the chassis, wherein the second cable clamp comprises a clamp body retaining the switch cable therein.

7. The electronic device of claim 6, wherein the clamp body is substantially U-shaped, with an elastic and narrow necked portion opposite to the bottom plate of the chassis.

* * * * *